United States Patent
Wang

(10) Patent No.: US 8,650,746 B2
(45) Date of Patent: Feb. 18, 2014

(54) LENS ASSEMBLY TOOL

(75) Inventor: Chien-Chun Wang, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/535,848

(22) Filed: Jun. 28, 2012

(65) Prior Publication Data

US 2013/0061446 A1  Mar. 14, 2013

(30) Foreign Application Priority Data

Sep. 14, 2011  (TW) .............................. 100132947 A

(51) Int. Cl.
- *B23Q 3/00* (2006.01)
- *G02B 7/02* (2006.01)
- *B23P 19/00* (2006.01)
- *B23P 21/00* (2006.01)

(52) U.S. Cl.
USPC ................ 29/790; 29/281.5; 29/759; 29/760; 29/771; 29/787; 29/464; 359/819; 359/823

(58) Field of Classification Search
USPC ........ 29/281.5, 283, 464, 468, 759, 760, 771, 29/787, 789, 790, 797; 359/619, 819, 823; 65/246; 451/5, 11; 53/235, 246, 247, 53/473, 467; 414/752.1; 206/445
See application file for complete search history.

(56) References Cited

U.S. PATENT DOCUMENTS

| | | | | | |
|---|---|---|---|---|---|
| 3,283,915 | A | * | 11/1966 | Maslow | 211/126.2 |
| 3,601,050 | A | * | 8/1971 | Puerta | 101/368 |
| 4,950,011 | A | * | 8/1990 | Borcea et al. | 294/2 |
| 5,215,140 | A | * | 6/1993 | Beane | 164/65 |
| 5,996,792 | A | * | 12/1999 | Alvaro et al. | 206/454 |
| 6,305,729 | B1 | * | 10/2001 | Mukasa | 294/185 |
| 6,624,948 | B1 | * | 9/2003 | Miller et al. | 359/619 |
| 7,551,357 | B2 | * | 6/2009 | Huang | 359/619 |
| 7,586,696 | B2 | * | 9/2009 | Wu | 359/819 |
| 7,813,062 | B2 | * | 10/2010 | Lin | 359/811 |
| 7,995,295 | B2 | * | 8/2011 | Chen | 359/811 |
| 8,322,527 | B2 | * | 12/2012 | Lai | 206/316.1 |
| 2002/0170867 | A1 | * | 11/2002 | Liu | 211/74 |

* cited by examiner

*Primary Examiner* — David Bryant
*Assistant Examiner* — Jun Yoo
(74) *Attorney, Agent, or Firm* — Altis Law Group, Inc.

(57) ABSTRACT

A lens assembly tool includes a lens receiving frame having a first surface, a positioning plate positioned on the lens receiving frame, and a pressing plate positioned on the positioning plate and having a second surface. The first surface defines a plurality of receiving holes. The positioning plate defines a plurality of through holes aligned with the plurality of receiving holes. The second surface forms a plurality of pressing punches aligned with the plurality of receiving holes.

6 Claims, 5 Drawing Sheets

LENS ASSEMBLY TOOL

BACKGROUND

1. Technical Field

The present disclosure generally relates to lens assembly tools, and particularly, to a lens assembly tool for assembling a plurality of lenses in one operation.

2. Description of the Related Art

In assembly of a camera module for a mobile phone, a group of lenses are placed in a lens tube by hand, and then the group of lenses are pressed by a pressing rod to position the group of lenses in a predetermined position. However, in mass manufacturing of the mobile phone lenses, each mobile phone lens needs to be singularly positioned by the pressing rod; therefore, the manufacturing efficiency of the mobile phone lenses is relatively low. In addition, the lenses are easily slanted when placed in the lens tube due to an uneven pressure and force distribution of the pressing rod.

Therefore, there is room for improvement within the art.

BRIEF DESCRIPTION OF THE DRAWING

The components in the drawings are not necessarily drawn to scale, the emphasis instead placed upon clearly illustrating the principles of the present disclosure. Moreover, in the drawings, like reference numerals designate corresponding parts throughout the several views.

DETAILED DESCRIPTION

Figure 1:
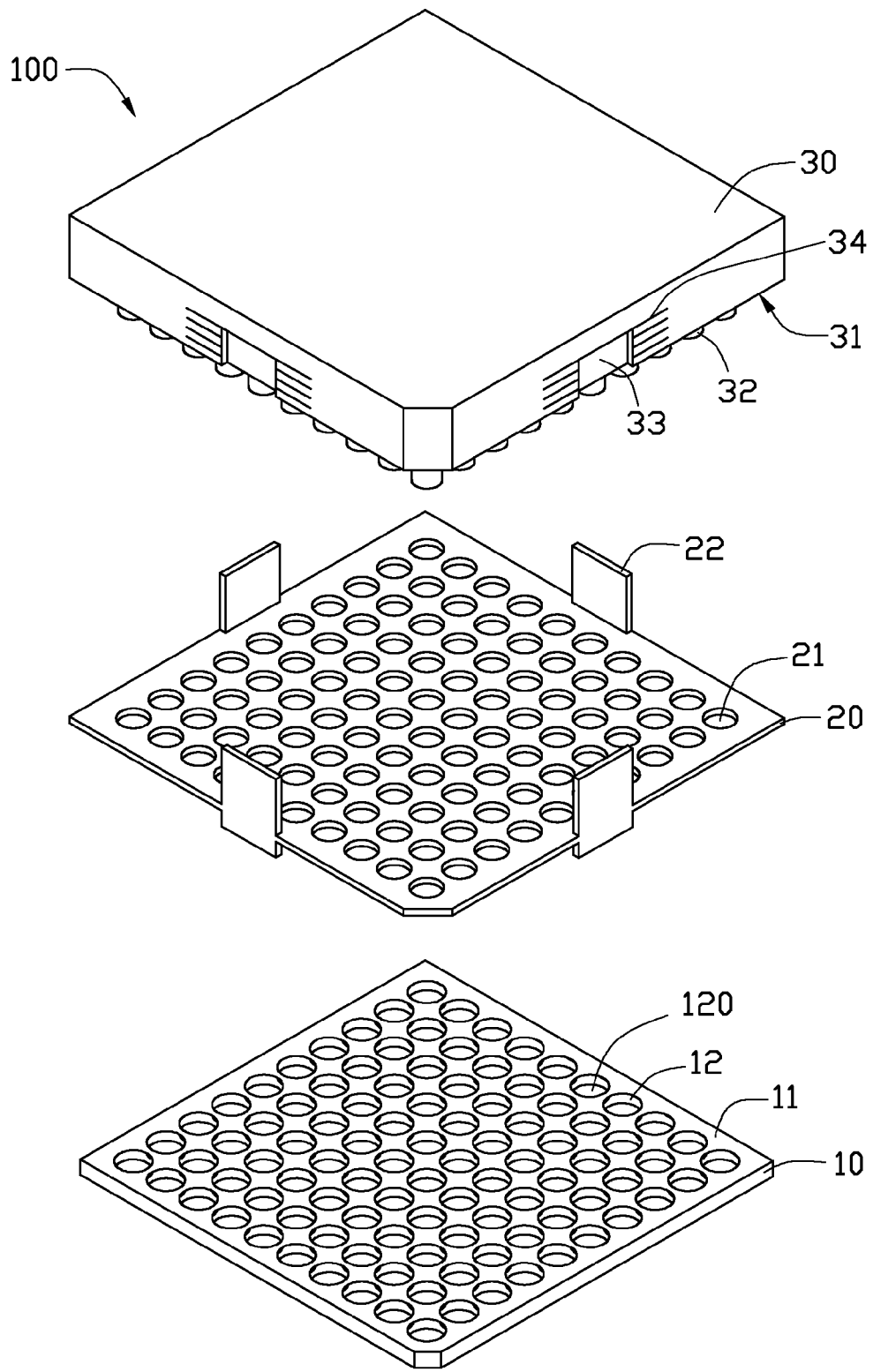
FIG. 1 is an isometric, exploded view of an embodiment of a lens assembly tool including a lens receiving frame, a positioning plate, and a pressing plate.
Figure 2:
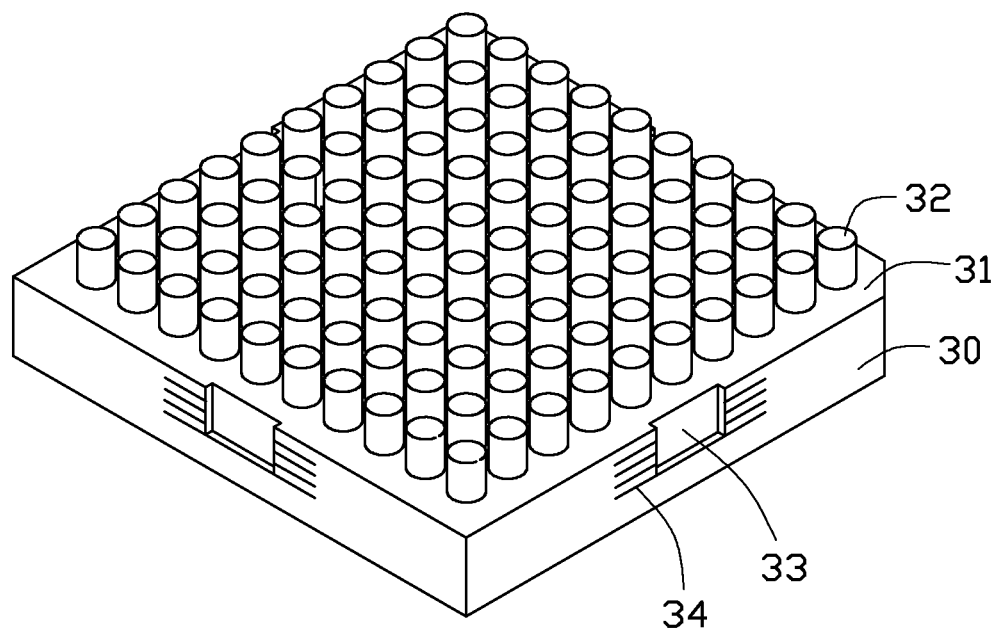
FIG. 2 is an isometric view of the pressing plate of FIG. 1.
Figure 3:
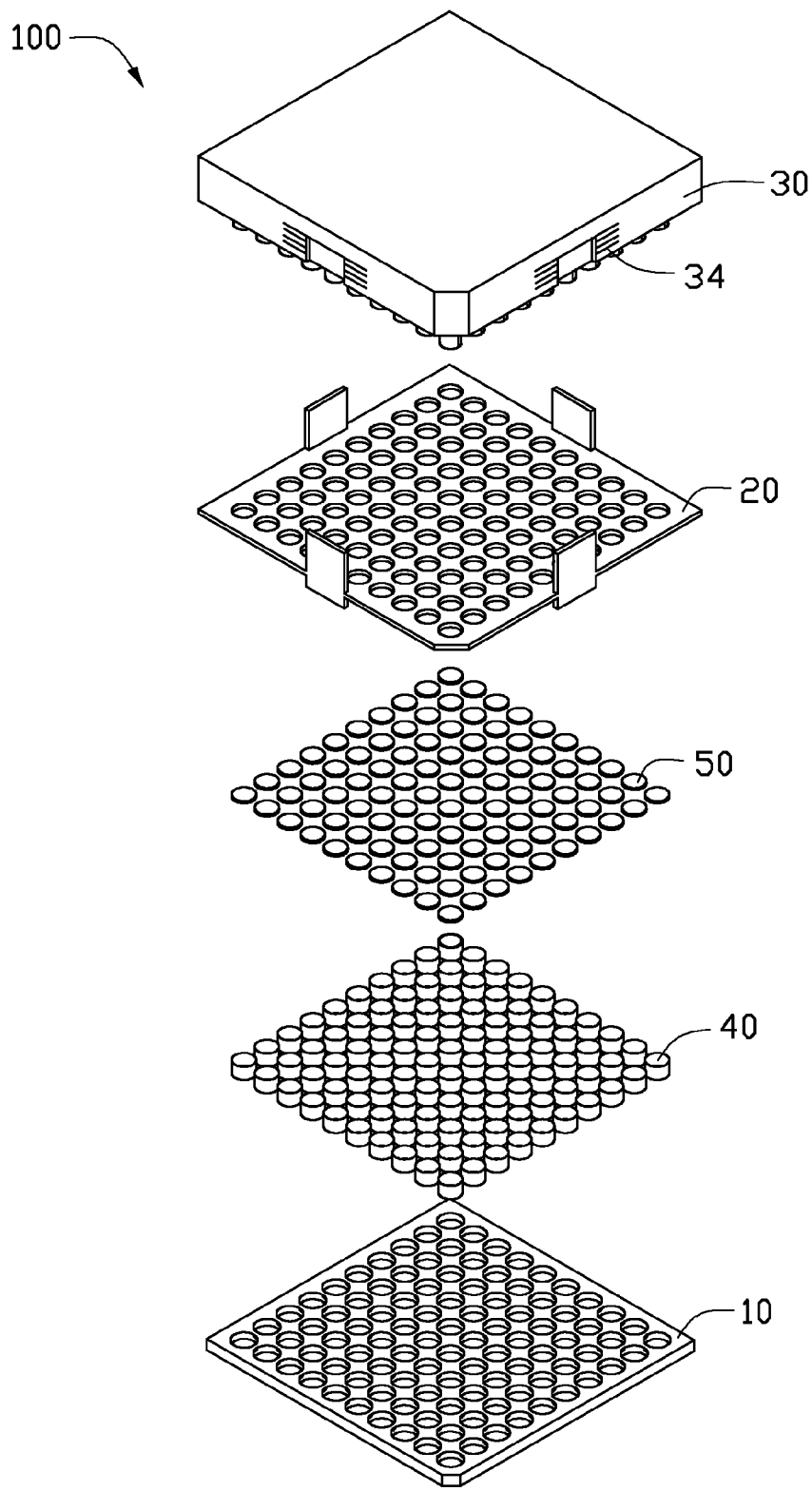
FIG. 3 is an isometric, exploded view of the lens assembly tool of FIG. 1 together with a plurality of lenses and a plurality of lens tubes.

Referring to FIGS. 1 through 3, an embodiment of a lens assembly tool 100 includes a lens receiving frame 10, a positioning plate 20, and a pressing plate 30. The lens assembly tool 100 is used to assemble a plurality of lenses 50 into a plurality of lens tubes 40, respectively. In an illustrated embodiment, the lens receiving frame 10, the positioning plate 20, and the pressing plate 30 are substantially rectangular.

The lens receiving frame 10 includes a first surface 11, and the first surface 11 defines a plurality of receiving holes 12. Each of the receiving holes 12 is a blind hole. A diameter of the receiving holes 12 is greater than that of the lens tubes 40.

The positioning plate 20 is positioned on the lens receiving frame 10, and defines a plurality of through holes 21. A diameter of the through holes 21 is equal to that of the lens tubes 40, thereby allowing for further positioning of the lens tubes 40 more precisely. A plurality of guiding plates 22 are formed on the edges of the positioning plate 20, respectively.

The lens tube 40 is positioned on the positioning plate 20. The pressing plate 30 includes a second surface 31 adjacent to the positioning plate 20. A plurality of pressing punches 32 are formed on the second surface 31. In the illustrated embodiment, the pressing punches 32, the receiving holes 12, and the through holes 21 are configured to be of one hundred in total number, respectively, and are arranged in a 10×10 square distribution. A length of the pressing punch 32 is larger than a distance between the second surface 31 and the first surface 11, and smaller than a distance between the second surface 31 and a bottom wall 120 defining the receiving holes 12. The pressing plate 30 defines a plurality of guiding slots 33 in the side surfaces thereof for receiving the guiding plate 22, respectively. The pressing plate 30 further sets a scale bar 34 adjacent to the guiding slot 33. The scale bar 34 shows or indicates a length of the guiding plate 22 received in the guiding slots 33. Therefore, when the guiding plate 22 is aligned at different scale readings of the scale bar 34, it indicates that the respective corresponding lengths of the pressing punches 32 entering into the lens tubes 40 are not the same.

In the illustrated embodiment, the pressing punches 32 are made of plastic materials, such as rubber or plastic.

Figure 4:
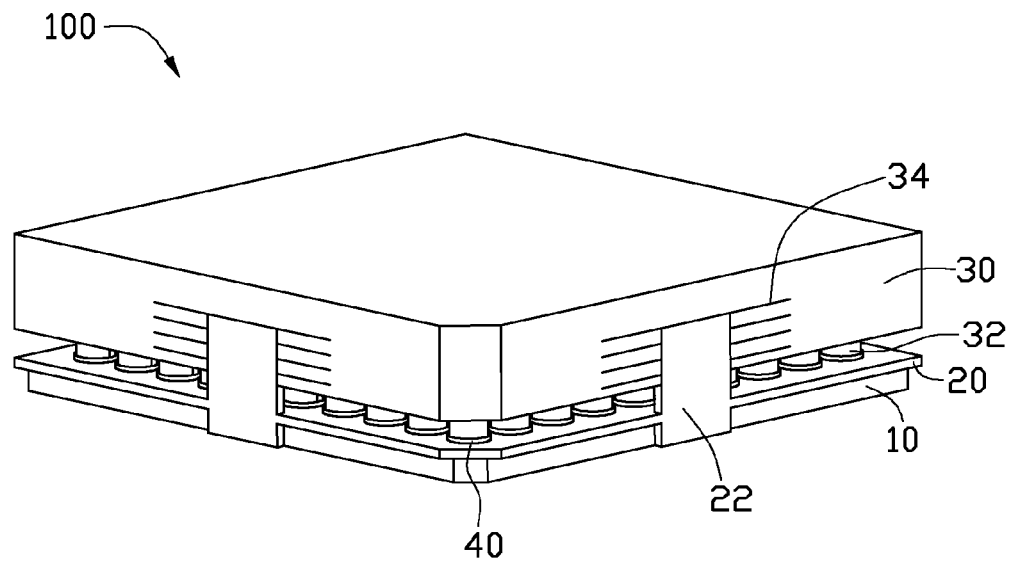
FIG. 4 is an isometric, assembled view of the lens assembly tool of FIG. 3 assembling the lenses into the lens tubes.
Figure 5:
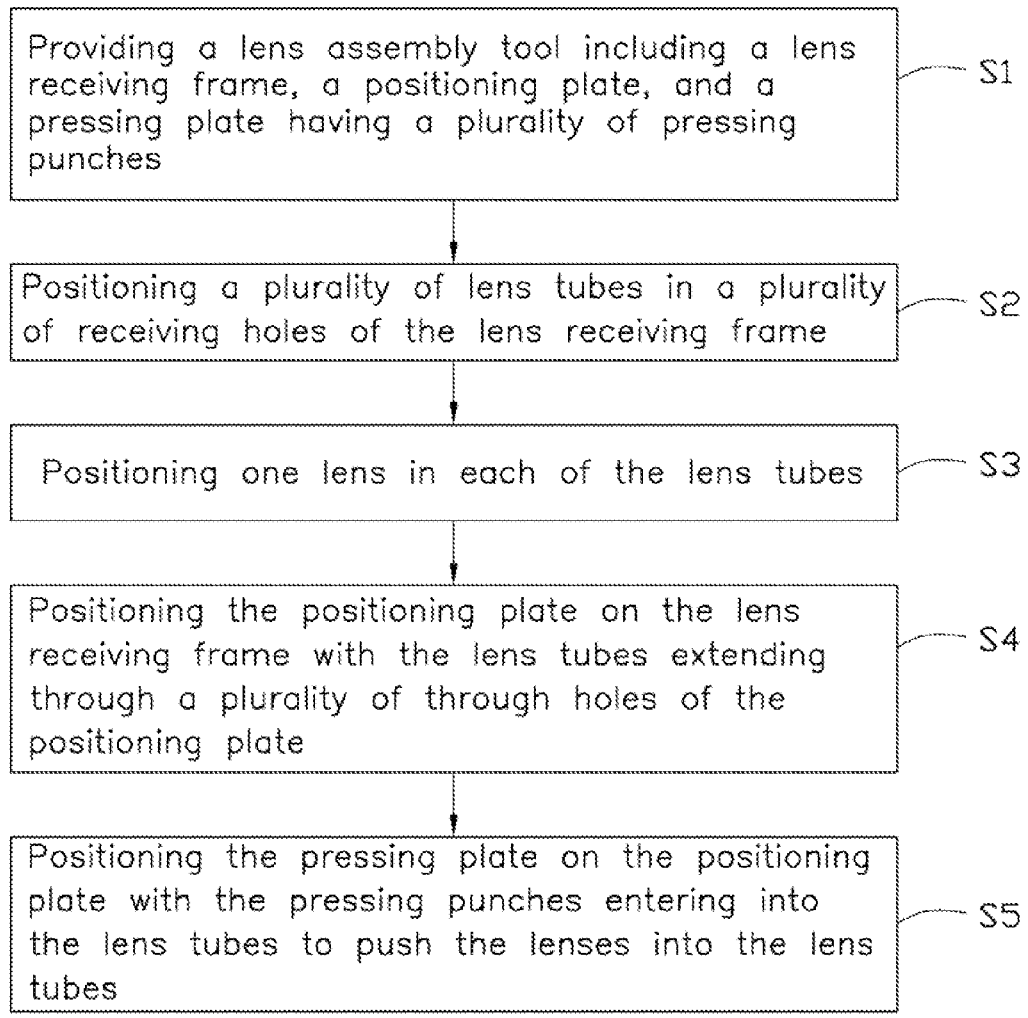
FIG. 5 is a flow chart of a lens assembly method using the lens assembly tool of FIG. 1.

Referring also to FIG. 4, in use, the lens tubes 40 are received in the receiving holes 12 of the lens receiving frame 10, and then the lenses 50 are positioned in the lens tubes 40. The positioning plate 20 is positioned on the lens receiving frame 10 with the lens tubes 40 extending through the through holes 21 of the positioning plate 20. The pressing plate 30 is positioned on the positioning plate 20 with the second surface 31 opposite to the positioning plate 20. The guiding plates 22 of the positioning plate 20 are inserted into the guiding slots 33 of the pressing plate 30, and simultaneously, the pressing punches 32 enter into the lens tubes 40. The pressing plate 30 is moved towards the positioning plate 20, and thus the lenses 50 reach their predetermined positions in the lens tubes 40.

Referring to FIGS. 1 through 5, a lens assembly method for assembling the lenses 50 into the lens tubes 40 is described as follows.

In a step S1, the lens assembly tool 100 is provided. In a step S2, the lens tubes 40 are positioned in the receiving holes 12 of the lens receiving frame 10. In a step S3, one lens 50 is positioned in each of the lens tubes 40. In a step S4, the positioning plate 20 is positioned on the lens receiving frame 10 with the lens tubes 40 extending through the through holes 21 of the positioning plate 20. In a step S5, the pressing plate 30 is positioned on the positioning plate 20 with the second surface 31 opposite to the positioning plate 20, and the pressing punches 32 enter into the lens tubes 40 to push the lenses 50 into the lens tubes 40.

The lens assembly tool 100 can assemble the plurality of lenses 50 into the plurality of lens tubes 40 in one operation, therefore, the assembling efficiency of the lenses 50 is highly enhanced. Furthermore, one pressing force is applied on the pressing plate 30 to push the pressing punches 32, such that the pressing force or pressure distribution on each of the pressing poles 32 is more even. Therefore, assembly errors in relation to the lenses 50 are avoided.

While the present disclosure has been described with reference to particular embodiments, the description is illustrative of the disclosure and is not to be construed as limiting the disclosure. Therefore, various modifications can be made to the embodiments by those of ordinary skill in the art without departing from the true spirit and scope of the disclosure, as defined by the appended claims.

What is claimed is:

1. A lens assembly tool for assembling a plurality of lenses into a plurality of lens tubes, comprising:
    a lens receiving frame having a first surface, the first surface defining a plurality of receiving holes for receiving the lens tubes, wherein a diameter of the receiving holes is larger than that of the lens tubes;
    a positioning plate positioning on the lens receiving frame and defining a plurality of through holes through which the lens tubes are extendable, wherein a diameter of the through holes is equal to that of the lens tubes; and a pressing plate positioning on the positioning plate and having a second surface, the second surface forming a plurality of pressing punches for pushing the lenses into the lens tubes.

2. The lens assembly tool of claim 1, wherein the lens receiving frame, the positioning plate, and the pressing plate are substantially rectangular.

3. The lens assembly tool of claim 1, wherein the receiving holes are a plurality of blind holes.

4. The lens assembly tool of claim 1, wherein a length of each pressing punch is larger than a distance between the second surface and the first surface, and smaller than a distance between the second surface and a bottom wall defining the receiving holes.

5. The lens assembly tool of claim 1, wherein the positioning plate forms a plurality of guiding plates, and the pressing plate defines a plurality of guiding slots for receiving the guiding plates.

6. The lens assembly tool of claim 5, wherein the pressing plate further has a plurality of scale bars, with each scale bar adjacent to a respective one of the plurality of guiding slots.

\* \* \* \* \*